(12) United States Patent
Ng et al.

(10) Patent No.: US 12,354,939 B2
(45) Date of Patent: Jul. 8, 2025

(54) MULTI-ROLE SEMICONDUCTOR DEVICE SUBSTRATES, SEMICONDUCTOR DEVICE ASSEMBLIES EMPLOYING THE SAME, AND METHODS FOR FORMING THE SAME

(71) Applicant: Micron Technology, Inc., Boise, ID (US)

(72) Inventors: Hong Wan Ng, Singapore (SG); Chin Hui Chong, Singapore (SG); Kelvin Tan Aik Boo, Singapore (SG); Seng Kim Ye, Singapore (SG)

(73) Assignee: Micron Technology, Inc., Boise, ID (US)

( * ) Notice: Subject to any disclaimer, the term of this patent is extended or adjusted under 35 U.S.C. 154(b) by 461 days.

(21) Appl. No.: 17/686,225

(22) Filed: Mar. 3, 2022

(65) Prior Publication Data
US 2023/0282559 A1 Sep. 7, 2023

(51) Int. Cl.
| | | |
|---|---|---|
| *H01L 23/498* | (2006.01) | |
| *H01L 21/48* | (2006.01) | |
| *H01L 23/00* | (2006.01) | |
| *H01L 23/552* | (2006.01) | |
| *H01L 25/065* | (2023.01) | |

(52) U.S. Cl.
CPC .... *H01L 23/49838* (2013.01); *H01L 21/4846* (2013.01); *H01L 23/49816* (2013.01); *H01L 23/552* (2013.01); *H01L 24/08* (2013.01); *H01L 24/48* (2013.01); *H01L 24/49* (2013.01); *H01L 24/80* (2013.01); *H01L 25/0652* (2013.01); *H01L 25/0657* (2013.01); *H01L 2224/08225* (2013.01); *H01L 2224/48145* (2013.01); *H01L 2224/48225* (2013.01); *H01L 2224/49112* (2013.01); *H01L 2224/80001* (2013.01); *H01L 2225/06506* (2013.01); *H01L 2225/0651* (2013.01); *H01L 2225/06562* (2013.01)

(58) Field of Classification Search
CPC ........... H01L 23/49838; H01L 21/4846; H01L 24/08; H01L 24/48; H01L 24/49; H01L 24/13; H01L 2224/48145; H01L 23/552; H01L 25/0657; H01L 25/0652; H01L 25/065
USPC ......................................................... 257/734
See application file for complete search history.

(56) References Cited

U.S. PATENT DOCUMENTS

| | | | |
|---|---|---|---|
| 2007/0210340 A1* | 9/2007 | Zampardi | ........... H01L 29/7371 257/E29.189 |
| 2016/0043206 A1* | 2/2016 | Ikegami | .............. H01L 21/3085 438/138 |
| 2016/0056127 A1* | 2/2016 | Lee | ......................... H01L 24/49 257/659 |

* cited by examiner

*Primary Examiner* — Didarul A Mazumder
(74) *Attorney, Agent, or Firm* — Dorsey & Whitney LLP (57) ABSTRACT

A semiconductor device assembly is provided. The assembly includes a substrate having an upper surface on which is disposed a first device contact, a keep-out region extending from a first side surface of the substrate to a second side surface of the substrate opposite the first, and at least one trace coupled to the first device contact and extending across the keep out region towards a third side surface of the substrate. The assembly further includes at least one semiconductor device disposed over the upper surface of the substrate and coupled to the first device contact. The keep-out region of the substrate is free from conductive structures other than the at least one trace.

15 Claims, 7 Drawing Sheets

MULTI-ROLE SEMICONDUCTOR DEVICE SUBSTRATES, SEMICONDUCTOR DEVICE ASSEMBLIES EMPLOYING THE SAME, AND METHODS FOR FORMING THE SAME

TECHNICAL FIELD

The present disclosure generally relates to semiconductor device assemblies, and more particularly relates to multi-role semiconductor device substrates, semiconductor device assemblies employing the same, and methods for forming the same.

BACKGROUND

Microelectronic devices generally have a die (i.e., a chip) that includes integrated circuitry with a high density of very small components. Typically, dies include an array of very small bond pads electrically coupled to the integrated circuitry. The bond pads are external electrical contacts through which the supply voltage, signals, etc., are transmitted to and from the integrated circuitry. After dies are formed, they are "packaged" to couple the bond pads to a larger array of electrical terminals that can be more easily coupled to the various power supply lines, signal lines, and ground lines. Conventional processes for packaging dies include electrically coupling the bond pads on the dies to an array of leads, ball pads, or other types of electrical terminals, and encapsulating the dies to protect them from environmental factors (e.g., moisture, particulates, static electricity, and physical impact).

DETAILED DESCRIPTION

Specific details of several embodiments of semiconductor devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

Semiconductor device assemblies come in a wide variety of configurations, with different dimensions, with different numbers and kinds of semiconductor dies packaged therein, and with various external connection schemes. Although some configurations overlap in some respects (e.g., two configurations with different dimensions and/or different numbers and kinds of semiconductor devices packaged therein might share an identical external connection schema such as a ball grid array with the same dimensions, pitch, and pin-out arrangement), separate substrate designs have conventionally been required for each and every possible configuration. The wide variety of substrate designs conventionally required contribute greatly to the cost and complexity of manufacturing and inventory management.

To address these drawbacks and others, various embodiments of the present application provide multi-role substrates in which a single substrate design is compatible with more than one semiconductor device assembly configuration (e.g., multiple assembly configurations with a common external connection scheme). The multi-role substrate can include multiple redundant contacts to which different semiconductor devices can be variously connected, with the redundant contacts separated by a keep-out zone of the substrate in which the only conductive elements are traces that connect the redundant contacts on opposing sides of the keep-out zone. In one configuration, the substrate can be reduced in size by sawing/cutting along one or more of the keep-out zones to remove one or more outboard regions of the substrate carrying some of the redundant contacts. When the contacts connected by the traces are ground contacts, the traces thus exposed by sawing/cutting through the keep-out zone can optionally be connected to an electromagnetic interference (EMI) shield of the package for improved electrical performance.

Figure 1:
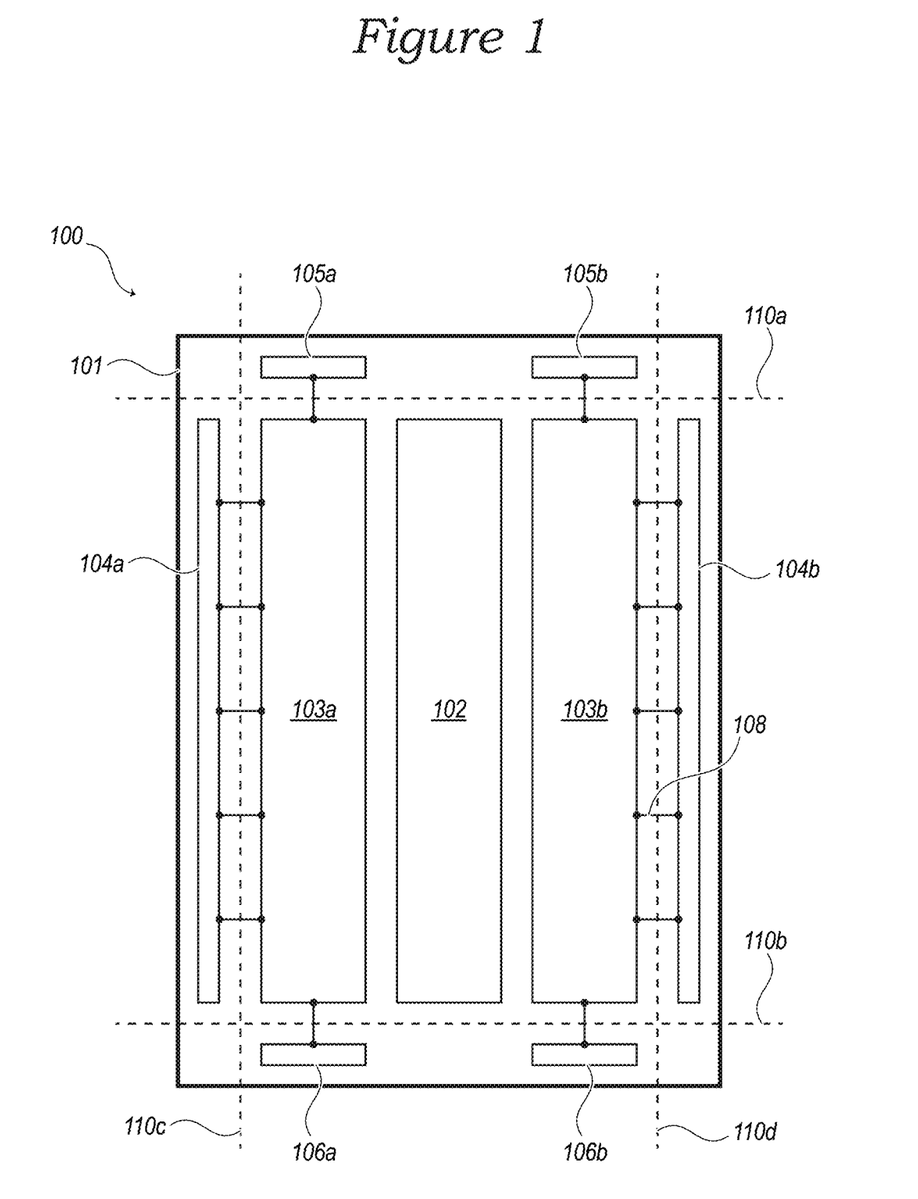
FIG. 1 is a simplified schematic overhead plan view of a multi-role semiconductor device substrate in accordance with one embodiment of the present disclosure.

FIG. 1 is a simplified schematic overhead plan view of a multi-role semiconductor device substrate in accordance with one embodiment of the present disclosure. Substrate 100 includes a substrate body 101 (e.g., a printed circuit board (PCB) or the like) on an upper surface of which are disposed a variety of electrical contacts configured to route signals to external package contacts (not illustrated) on a lower surface of the substrate body 101. In the present illustrated embodiment, the contacts include one or more non-redundant contacts 102 (illustrated schematically as an area, which may include a variety of discrete contact pads, bond fingers, etc.) and a plurality of redundant contacts. The redundant contacts can include one or more inboard contacts such as contacts 103a and 103b, and one or more outboard contacts, such as contacts 104a, 104b, 105a, 105b, 106a, and 106b, each electrically coupled to their corresponding inboard contact by a corresponding one or more traces, such as trace 108. Although illustrated schematically as a single large area, the inboard contacts 103a and 103b may alternatively provide a plurality of discrete inboard contacts, each separately connected to a corresponding outboard contact. In another embodiment, inboard contacts 103a and 103b may be large ground plane contacts, each redundantly connected to a number of other outboard contacts. The traces 108 may be disposed at the upper surface of the substrate body 101, or may alternatively be disposed at an intermediate depth of the substrate body 101, or may even be disposed at the lower surface of the substrate body 101 (or any combination thereof).

The inboard contacts 103a and 103b are separated from the corresponding outboard contacts that connect thereto via the traces 108 by keep-out zones, in which the substrate 100 is substantially free of any conductive structure excepting the traces 108 that pass therethrough. For example, in the embodiment illustrated in FIG. 1, the keep-out zones lie along the lines 110a, 110b, 110c, and 110d (e.g., under and adjacent the illustrated lines). The redundancy of the contacts, together with the configuration of the keep-out zones in which the only conductive structures are the traces 108, permit the substrate 100 to provide similar functionality (e.g., similar routing of upper surface contacts to external package contacts) in two or more different configurations—in which between zero and four of the regions outboard of the lines 110a-110d are removed from the substrate. This may be more easily understood with reference to FIG. 2, which is a simplified schematic overhead plan view of a multi-role semiconductor device substrate like substrate 100, but which has been adapted for use in an alternate configuration in accordance with one embodiment of the present disclosure.

Figure 2:
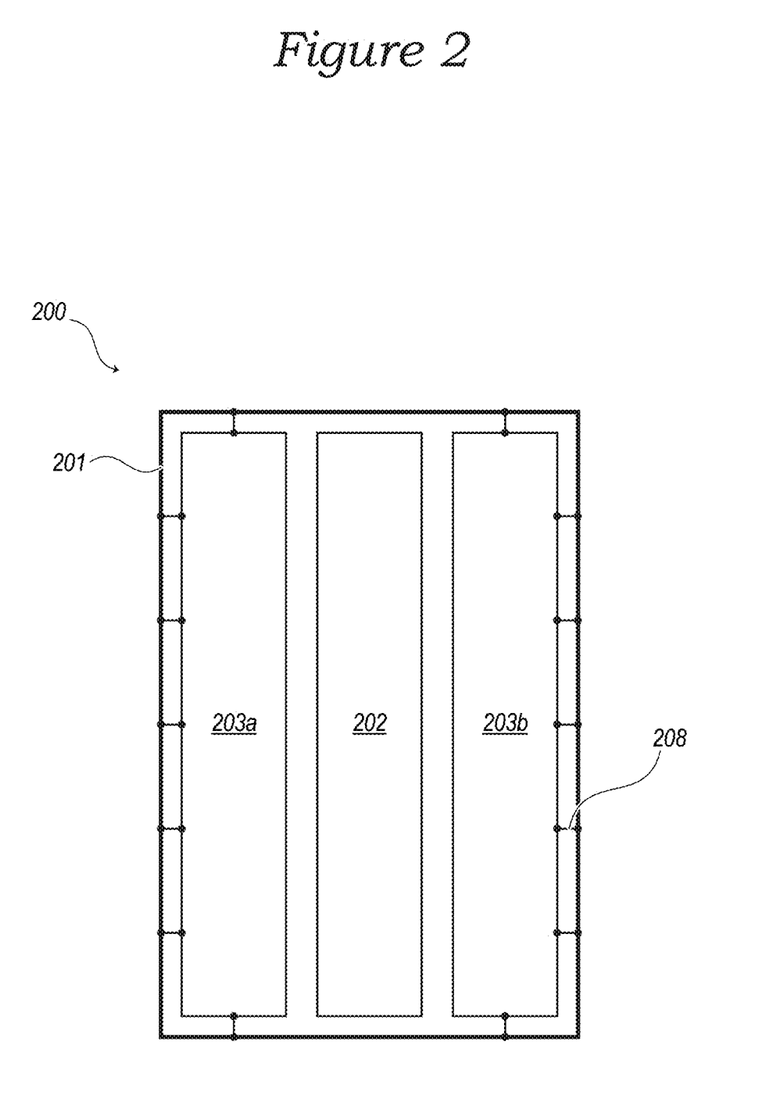
FIG. 2 is a simplified schematic overhead plan view of a multi-role semiconductor device substrate adapted for use in an alternate configuration in accordance with one embodiment of the present disclosure.

Turning to FIG. 2, substrate 200 can be seen to have similar features to the portion of substrate 100 inboard of the lines 110a-110d—i.e., contacts 202, 203a, and 203b. These can similarly be areas in which multiple discrete contacts are provided, or alternatively large planar contacts (e.g., for power and/or ground). The contacts 203a and 203b are electrically connected to traces, such as trace 208, which extend laterally away from the contacts 203a and 203b towards edge surfaces of the substrate body 201. By separating those portions of substrate 100 outboard of the lines 110a-110d illustrated in FIG. 1 (e.g., by sawing, cutting, laser dicing, etching, etc.), the traces 108 can be exposed at the side surface of the substrate body 101, as has been done to traces 208 which are exposed at side surfaces of the substrate body 201. These exposed surfaces can be electrically coupled to other structures (e.g., an EMI shield when the traces are coupled to ground plane contacts), or alternatively capped with a dielectric or insulating material (e.g., mold compound) to prevent inadvertent electrical contact therewith.

Substrate 200 can provide similar external connectivity to packaged semiconductor devices as does substrate 100, but with a smaller form factor appropriate to a different package configuration (e.g., in which smaller, fewer, or more closely-packed semiconductor device are packaged). Providing a substrate with a single design (e.g., the design of substrate 100) which can be converted to use in one or more additional configurations (e.g., by removing one or more of the regions of the substrate outboard from the lines which correspond to the keep-out zones separating corresponding redundant contacts) can provide significant advantages in cost, manufacturing simplicity, and inventory management as compared to convention approaches in which a dedicated distinct substrate is designed for each package configuration.

Figure 3:
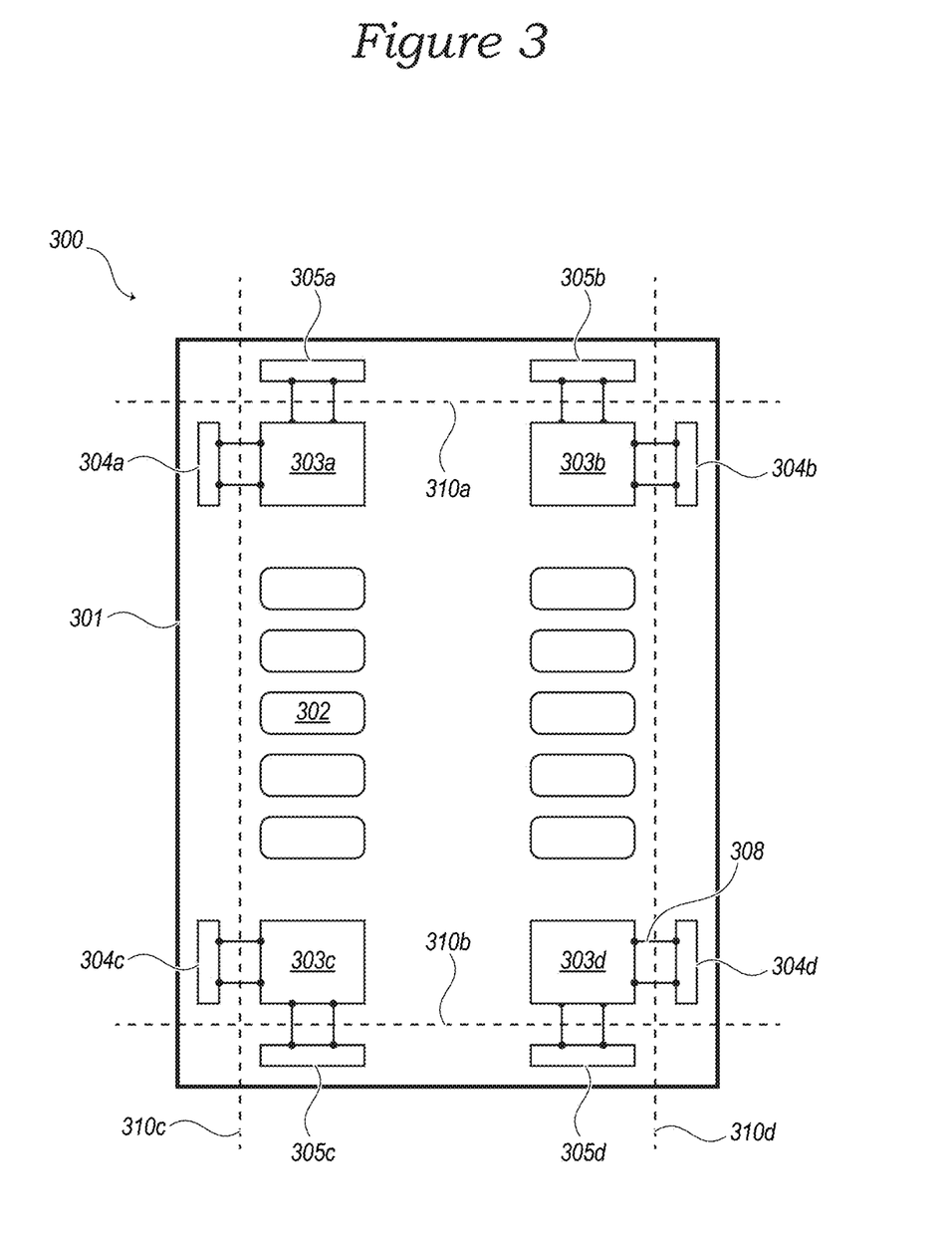
FIG. 3 is a simplified schematic overhead plan view of a multi-role semiconductor device substrate in accordance with one embodiment of the present disclosure.

Turning to FIG. 3, a simplified schematic overhead plan view of another multi-role semiconductor device substrate in accordance with another embodiment of the present disclosure. Substrate 300 includes a substrate body 301 (e.g., a PCB or the like) on an upper surface of which are disposed a variety of electrical contacts configured to route signals to external package contacts (not illustrated) on a lower surface of the substrate body 301. In the present illustrated embodiment, the contacts include one or more non-redundant contacts 302 and a plurality of redundant contacts. The redundant contacts can include one or more inboard contacts such as contacts 303a-303d, and one or more outboard contacts, such as contacts 304a-304d and 305a-305d, each electrically coupled to their corresponding inboard contact by a corresponding one or more traces, such as trace 308. The traces 308 may be disposed at the upper surface of the substrate body 301, or may alternatively be disposed at an intermediate depth of the substrate body 301, or may even be disposed at the lower surface of the substrate body 301 (or any combination thereof).

The inboard contacts 303a-303d are separated from the corresponding outboard contacts that connect thereto via the traces 308 by keep-out zones, in which the substrate 300 is substantially free of any conductive structure excepting the traces 308 that pass therethrough. For example, in the embodiment illustrated in FIG. 3, the keep-out zones lie along the lines 310a, 310b, 310c, and 310d (e.g., under and adjacent the illustrated lines). The redundancy of the contacts, together with the configuration of the keep-out zones in which the only conductive structures are the traces 308, permit the substrate 300 to provide similar functionality (e.g., similar routing of upper surface contacts to external package contacts) in two or more different configurations—in which between zero and four of the regions outboard of the lines 310a-310d are removed from the substrate. This may be more easily understood with reference to FIG. 4, which is a simplified schematic overhead plan view of a multi-role semiconductor device substrate like substrate 300, but which has been adapted for use in an alternate configuration in accordance with one embodiment of the present disclosure.

Figure 4:
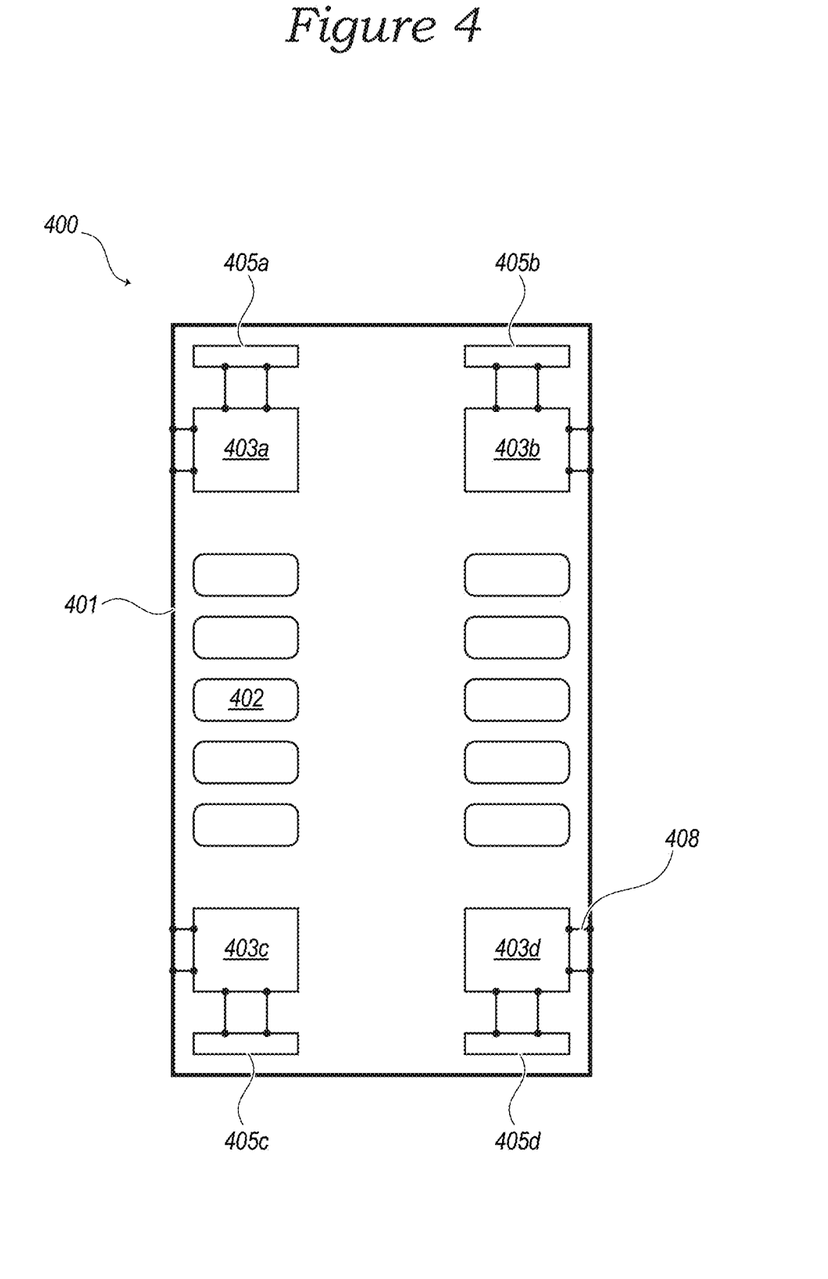
FIG. 4 is a simplified schematic overhead plan view of a multi-role semiconductor device substrate adapted for use in an alternate configuration in accordance with one embodiment of the present disclosure.

Turning to FIG. 4, substrate 400 can be seen to have similar features to the portion of substrate 300 inboard of the lines 310c and 310d—i.e., contacts 402, 403a-403d, 405a-405d. The contacts 403a-403d are electrically connected to traces, such as trace 408, which extend laterally away from the contacts 403a and 403d. Some of the traces 408 still couple the inboard contacts 403a-403d to outboard contacts 405a-405d, as not all of the portions of substrate 400 outboard of the keep-out zones have been removed. Still, as some portions of the substrate have been removed (i.e., those portions outboard of lines 310a and 310b), some of the traces 408 extend to a side surface of the substrate body 401. In this regard, by separating those portions of substrate 300 outboard of the lines 310a and 310b illustrated in FIG. 3 (e.g., by sawing, cutting, laser dicing, etching, etc.), the traces 308 can be exposed at the side surface of the substrate body 301, as has been done to traces 408 which are exposed at side surfaces of the substrate body 401. These exposed surfaces can be electrically coupled to other structures (e.g., an EMI shield when the traces are coupled to ground plane contacts), or alternatively capped with a dielectric or insulating material (e.g., mold compound) to prevent inadvertent electrical contact therewith.

Substrate 400 can provide similar external connectivity to packaged semiconductor devices as does substrate 300, but with a smaller form factor appropriate to a different package configuration (e.g., in which smaller, fewer, or more closely-packed semiconductor device are packaged). Providing a substrate with a single design (e.g., the design of substrate 300) which can be converted to use in one or more additional configurations (e.g., by removing one or more of the regions of the substrate outboard from the lines which correspond to the keep-out zones separating corresponding redundant contacts) can provide significant advantages in cost, manufacturing simplicity, and inventory management as compared to convention approaches in which a dedicated distinct substrate is designed for each package configuration.

Figure 5A:
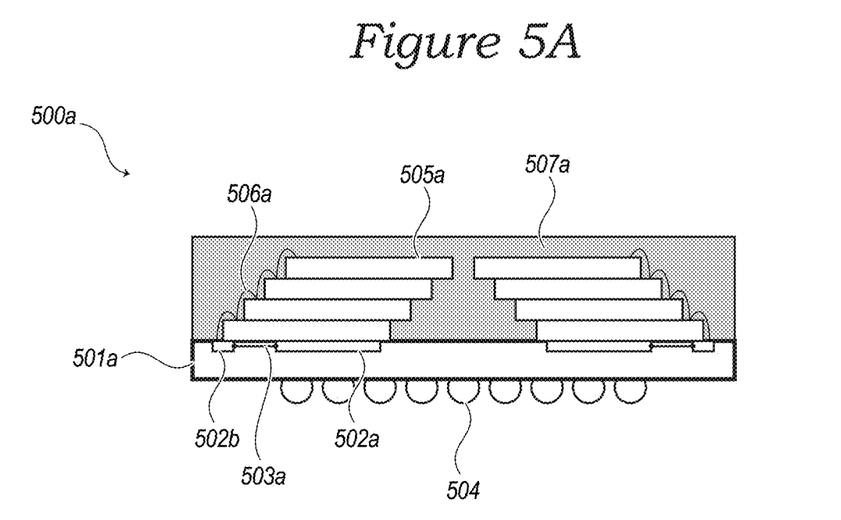
FIGS. 5A and 5B are simplified schematic cross-sectional views of semiconductor device assemblies including a multi-role semiconductor device substrate adapted for use in two alternate configurations in accordance with various embodiments of the present disclosure.
Figure 5B:
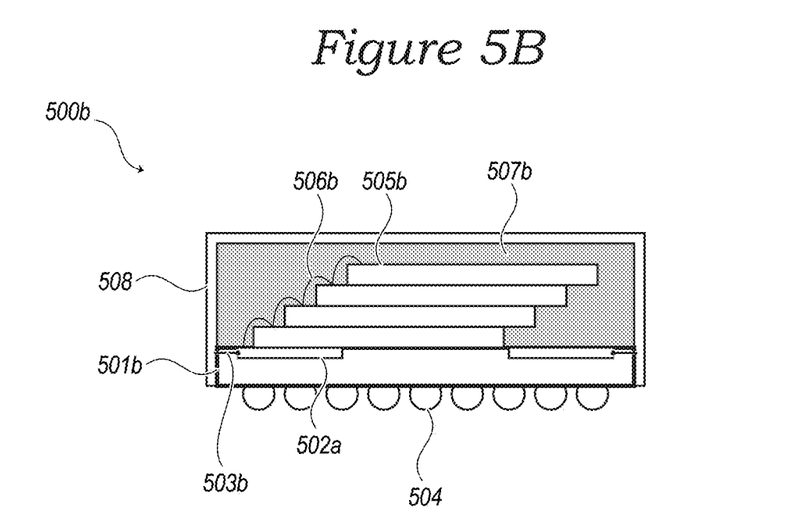

Two such alternative configurations for semiconductor device assemblies including the same multi-mode substrate are illustrated schematically in FIGS. 5A and 5B, in accordance with various embodiments of the present disclosure. In the first configuration illustrated in FIG. 5A, the semiconductor device assembly 500a includes a multi-mode substrate 501a arranged in a first configuration, in which redundant contacts 502a and 502b are coupled by a trace 503a extending therebetween (e.g., across keep-out zone of the substrate 501a, as illustrated in greater detail above). One or more stacks of semiconductor devices, such as semiconductor devices 505a, can be disposed over the substrate 501a and connected to the trace 508 and the redundant pads 502a and 502b by a number of wire bonds 506a. The redundant pads 502a and 502b can, in turn, be connected to corresponding ones of a plurality of external package contacts (e.g., external pads, solder balls, pins, etc.), such as external package contact 504, by a variety of traces, vias, and other conductive structures disposed in the substrate 501a (omitted from the illustration in the interest of clarity, but well-known to those of skill in the art). The semiconductor devices 505a, the wire bonds 506a, and the substrate 501a (e.g., at least the upper surface thereof) can be encapsulated by a mold compound 507a.

In the second configuration of FIG. 5B, a similar multi-mode substrate as that of FIG. 5A has been provided, but which has been processed to remove one or more of the substrate regions outboard of a keep-out zone, in accordance with one aspect of the present disclosure. In this regard, as can be seen with reference to FIG. 5B, the semiconductor device assembly 500b has a notably smaller lateral dimension due to the removal of regions outboard of the keep-out zone that separated redundant pads 502a and 502b in FIG. 5A. In semiconductor device assembly 500b, the substrate 501b includes the inboard pad 502a and a portion 503b of the trace 503a, which extends all the way to a side surface of the substrate 501b. A single stack of semiconductor devices 505b, larger than semiconductor devices 505a of semiconductor device assembly 500a, is disposed over the substrate and connected directly to the inboard contact 502a by a cascading series of wire bonds 506b. Like semiconductor device assembly 500a, semiconductor device assembly 500b has a plurality of external package contacts, such as external package contact 504, arranged in a similar manner (e.g., with a same number, pitch, dimension, and/or pin-out configuration), and to which the contact 502a is likewise connected through conductive structures in the substrate 501b (not illustrated). Likewise, a similar encapsulant, such as mold material 507b, encapsulates the semiconductor devices 505b, the wire bonds 506b, and at least a portion of the substrate 501b (e.g., the upper surface of the substrate 501b). Exploiting the exposure of the remaining portion 503b of a trace connected to contact 502a, an external conductive structure 508 (e.g., an EMI shield) is also provided, surrounding the semiconductor device assembly 500b on five sides and providing a ground connection between the EMI shield and a grounding contact among the plurality of external contacts. In an alternative arrangement in which EMI shielding is not desired, the mold compound 507b could instead be provided around the side surfaces of the substrate 501b, to insulate the exposed surface of trace portion 503b from inadvertent contact.

Figure 6:
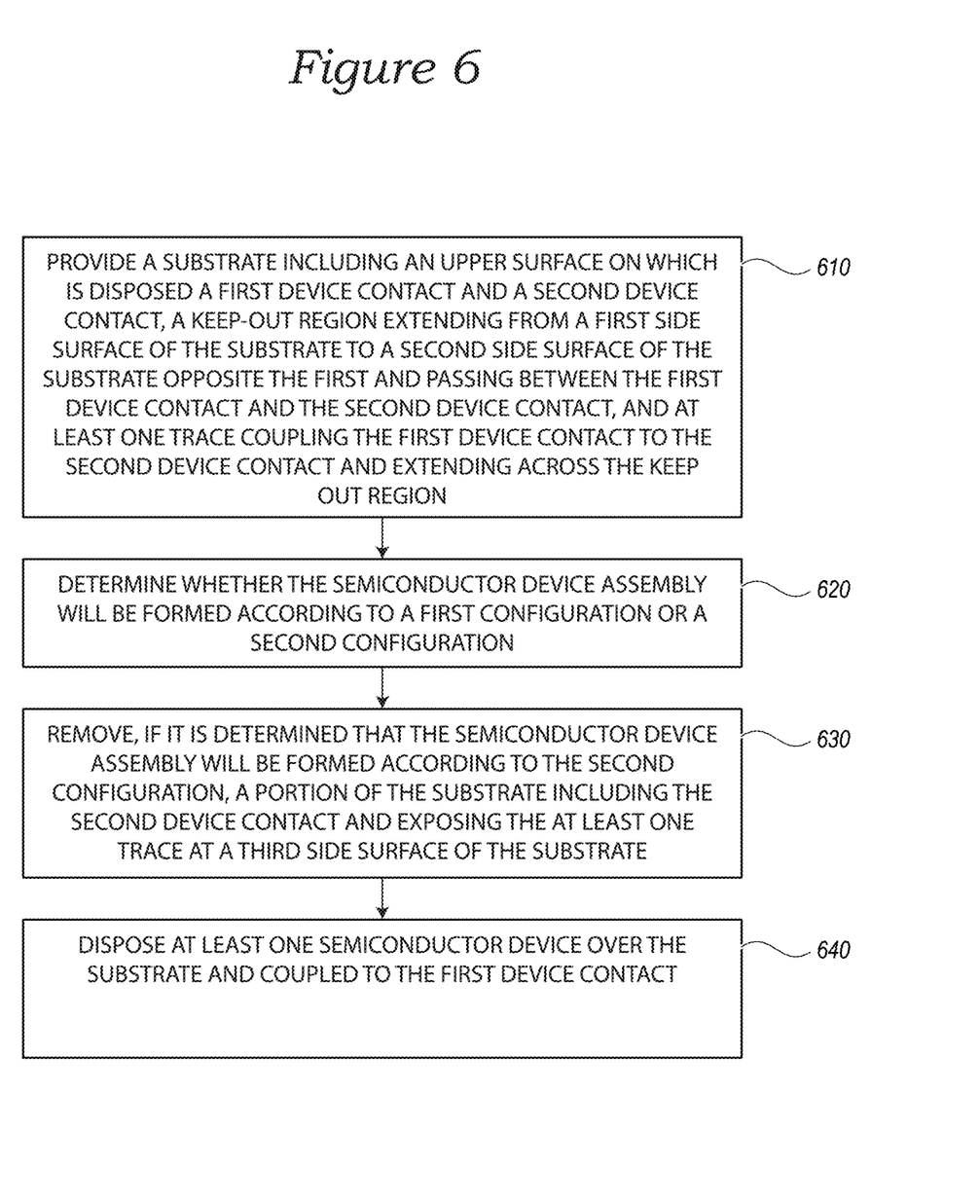
FIG. 6 is a flow chart illustrating a method for packaging a semiconductor device assembly in accordance with an embodiment of the present disclosure.

FIG. 6 is a flow chart illustrating a method for packaging a semiconductor device assembly in accordance with an embodiment of the present disclosure. The method includes providing (box 610) a multi-mode substrate that includes an upper surface on which is disposed a first contact and a second contact, a keep-out region extending from a first side surface of the substrate to a second side surface of the substrate opposite the first and passing between the first contact and the second contact, and at least one trace coupling the first contact to the second contact and extending across the keep out region. As set forth above, the keep-out region of the substrate is free from conductive structures other than the at least one trace. The method further includes determining (box 620) whether the semiconductor device assembly will be formed according to a first configuration or a second configuration, and removing (box 630), if it is determined that the semiconductor device assembly will be formed according to the second configuration, a portion of the substrate including the second contact and exposing the at least one trace at a third side surface of the substrate. The method further includes disposing (box 640) at least one semiconductor device over the substrate and coupled to the first contact. The at least one semiconductor device is coupled to the first contact through the second contact and the at least one trace if it is determined that the semiconductor device assembly will be formed according to the first configuration, and the at least one semiconductor device is directly coupled to the first contact if it is determined that the semiconductor device assembly will be formed according to the second configuration.

In accordance with one aspect of the present disclosure, the semiconductor device assemblies illustrated and described above could include memory dies, such as dynamic random access memory (DRAM) dies, NOT-AND (NAND) memory dies, NOT-OR (NOR) memory dies, magnetic random access memory (MRAM) dies, phase change memory (PCM) dies, ferroelectric random access memory (FeRAM) dies, static random access memory (SRAM) dies, or the like. In an embodiment in which multiple dies are provided in a single assembly, the semiconductor devices could be memory dies of a same kind (e.g., both NAND, both DRAM, etc.) or memory dies of different kinds (e.g., one DRAM and one NAND, etc.). In accordance with another aspect of the present disclosure, the semiconductor dies of the assemblies illustrated and described above could include logic dies (e.g., controller dies, processor dies, etc.), or a mix of logic and memory dies (e.g., a memory controller die and a memory die controlled thereby).

Figure 7:
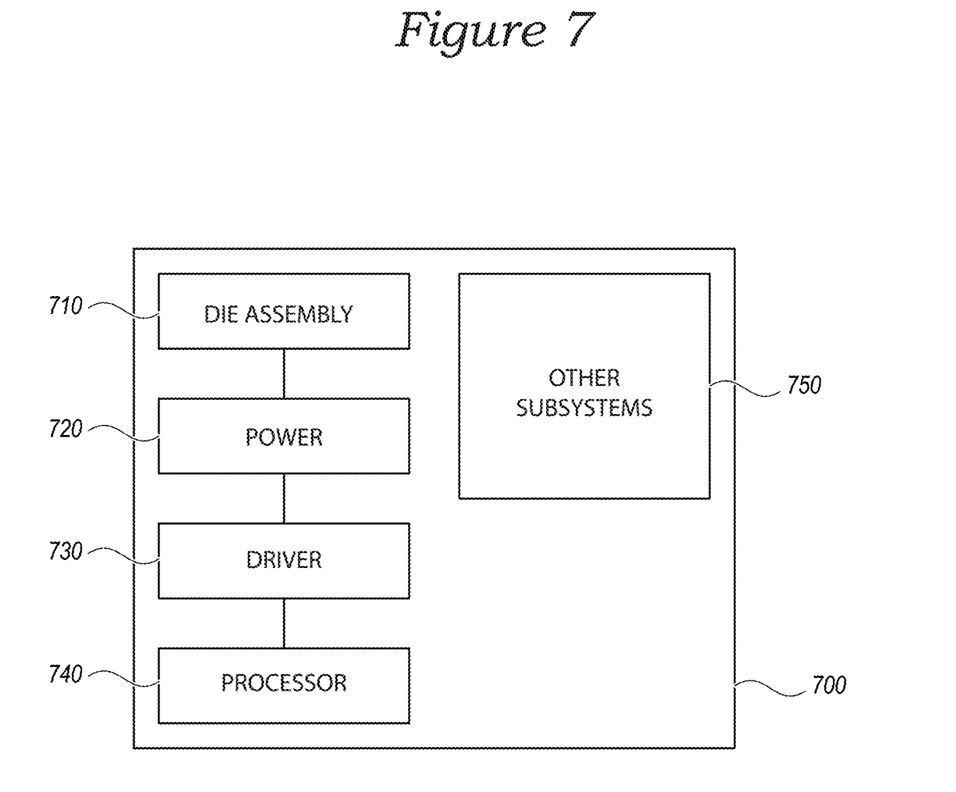
FIG. 7 is a schematic view showing a system that includes a semiconductor device assembly configured in accordance with an embodiment of the present disclosure.

Any one of the semiconductor devices and semiconductor device assemblies described above can be incorporated into any of a myriad of larger and/or more complex systems, a representative example of which is system 700 shown schematically in FIG. 7. The system 700 can include a semiconductor device assembly (e.g., or a discrete semiconductor device) 702, a power source 704, a driver 706, a processor 708, and/or other subsystems or components 710. The semiconductor device assembly 702 can include features generally similar to those of the semiconductor devices described above. The resulting system 700 can perform any of a wide variety of functions, such as memory storage, data processing, and/or other suitable functions. Accordingly, representative systems 700 can include, without limitation, hand-held devices (e.g., mobile phones, tablets, digital readers, and digital audio players), computers, vehicles, appliances and other products. Components of the system 700 may be housed in a single unit or distributed over multiple, interconnected units (e.g., through a communications network). The components of the system 700 can also include remote devices and any of a wide variety of computer readable media.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device assembly comprising:
    a printed circuit board (PCB) substrate including:
        an upper surface on which is disposed a first device contact,
        a keep-out region extending from a first side surface of the substrate to a second side surface of the substrate opposite the first, and
        at least one trace coupled to the first device contact and extending across the keep out region towards a third side surface of the substrate; and
    at least one semiconductor device disposed over the upper surface of the substrate and coupled to the first device contact,
    wherein the keep-out region of the substrate is free from conductive structures other than the at least one trace,
    wherein the at least one trace is exposed at the third side surface of the substrate, and
    further comprising an electromagnetic interference (EMI) shield electrically coupled to the exposed at least one trace at the third side surface of the substrate.

2. The semiconductor device assembly of claim 1, further comprising a second device contact disposed on the upper surface and coupled to the first device contact by the at least one trace.

3. The semiconductor device assembly of claim 2, wherein the second device contact is on an opposite side of the keep-out region from the first device contact.

4. The semiconductor device assembly of claim 3, wherein the at least one semiconductor device is coupled to the first device contact through the second device contact and the at least one trace.

5. The semiconductor device assembly of claim 1, wherein the keep-out region extends to the third side surface of the substrate.

6. The semiconductor device assembly of claim 1, further comprising at least one external contact disposed on a lower surface of the substrate opposite the upper surface, the at least one external contact coupled to the first device contact through the substrate.

7. A printed circuit board (PCB) substrate configured for use with different semiconductor device packages, the substrate comprising:
    an upper surface on which is disposed a first device contact;
    a keep-out region extending from a first side surface of the substrate to a second side surface of the substrate opposite the first; and
    at least one trace coupled to the first device contact and extending across the keep out region towards a third side surface of the substrate,
    wherein the keep-out region of the substrate is free from conductive structures other than the at least one trace,
    wherein the at least one trace is exposed at the third side surface of the substrate, and
    further comprising an electromagnetic interference (EMI) shield electrically coupled to the exposed at least one trace at the third side surface of the substrate.

8. The substrate of claim 7, further comprising a second device contact disposed on the upper surface and coupled to the first device contact by the at least one trace.

9. The substrate of claim 8, wherein the second device contact is on an opposite side of the keep-out region from the first device contact.

10. The substrate of claim 7, wherein the keep-out region extends to the third side surface of the substrate.

11. The substrate of claim 7, further comprising at least one external contact disposed on a lower surface of the substrate opposite the upper surface, the at least one external contact coupled to the first device contact through the substrate.

12. The substrate of claim 7, wherein the keep-out region is a first keep-out region and the at least one trace is a first at least one trace, the substrate further comprising:
- a third device contact disposed on the upper surface;
- a second keep-out region extending from the first side surface to the second side surface; and
- a second at least one trace coupled to the third device contact and extending across the second keep out region towards a fourth side surface of the substrate opposite the third side surface.

13. The substrate of claim 12, further comprising a fourth device contact disposed on the upper surface and coupled to the third device contact by the second at least one trace.

14. The substrate of claim 7, wherein the keep-out region is a first keep-out region and the at least one trace is a first at least one trace, the substrate further comprising:
- a third device contact disposed on the upper surface;
- a second keep-out region extending from the third side surface to a fourth side surface of the substrate opposite the third side surface; and
- a second at least one trace coupled to the third device contact and extending across the second keep out region towards the first side surface.

15. The substrate of claim 14, further comprising a fourth device contact disposed on the upper surface and coupled to the third device contact by the second at least one trace.

\* \* \* \* \*